US006828570B2

(12) United States Patent
Veneklasen et al.

(10) Patent No.: US 6,828,570 B2
(45) Date of Patent: Dec. 7, 2004

(54) TECHNIQUE FOR WRITING WITH A RASTER SCANNED BEAM

(75) Inventors: Lee H. Veneklasen, deceased, late of Castro Valley, CA (US); by Mary B. Veneklasen, legal representative, Castro Valley, CA (US); Stephen Rishton, Fremont, CA (US); Stacey J. Winter, Alameda, CA (US); Volker Boegli, Rossdorf (DE); Huei Mei Kao, Fremont, CA (US)

(73) Assignee: Applied Materials, Inc., Santa Clara, Inc., CA (US)

( * ) Notice: Subject to any disclaimer, the term of this patent is extended or adjusted under 35 U.S.C. 154(b) by 0 days.

(21) Appl. No.: 10/114,399

(22) Filed: Apr. 1, 2002

(65) Prior Publication Data

US 2003/0183782 A1 Oct. 2, 2003

(51) Int. Cl.$^7$ .............................................. H01J 37/302

(52) U.S. Cl. .............................. 250/492.2; 250/492.22; 250/492.23; 250/311; 250/307

(58) Field of Search .......................... 250/492.1, 492.2, 250/492.21, 492.22, 492.23, 492.3, 396, 400, 307; 430/296

(56) References Cited

U.S. PATENT DOCUMENTS

| | | | |
|---|---|---|---|
| 4,698,509 A | * 10/1987 | Wells et al. | ............. 250/492.2 |
| 5,502,306 A | 3/1996 | Meisburger et al. | |
| 5,874,198 A | * 2/1999 | Okino | ..................... 250/492.3 |
| 5,876,902 A | 3/1999 | Veneklasen et al. | |
| 6,011,269 A | 1/2000 | Veneklasen et al. | |

OTHER PUBLICATIONS

U.S. patent application Ser. No. 09/851,398, Rishton et al., filed May 8, 2001.
U.S. patent application Ser. No. 10/114,586, Veneklasen, filed Apr. 1, 2002.
Veneklasen, Lee H. *Some General Considerations Concerning the Optics of the Field Emission Illumination System*, Optik vol. 36, No. 4, pp. 410–433 (1972).
Veneklasen, Lee H. *Auger Electron Spectroscopy Applications of a New Integral Field Emission Gun With a Small Spot Size*, Thin Solid Films, 57, pp. 213–219 (1979).
Munro, E. et al. *High resolution, low–energy beams by means of mirror optics*, J. Vac. Sci. Tech. B 6, No. 6, pp. 1971–1976 (1988).
Chmelik, J. et al. *Comparing cathode lens configurations for low energy electron microscopy*, Optik 83, No. 5, pp. 155–160 (1989).
Chang, T.H.P. et al. *Microminiaturization of electron optical systems*, J. Vac. Sci. Tech. B 8, No. 6, pp. 1698–1705 (1990).

(List continued on next page.)

Primary Examiner—John R. Lee
Assistant Examiner—James P. Hughes
(74) Attorney, Agent, or Firm—Kenneth C. Brooks (57) ABSTRACT

Provided is a technique for generating patterns with a raster scanned beam in a photolithographic system that employs a multiple blank position flash cycle. In accordance with one embodiment of the present invention, a beam creates a shadow of a first aperture that impinges upon a region of a stop, referred to as a first blank position. The beam is deflected so that the shadow of the first aperture moves along a first direction to a flash position, in which a portion thereof superimposes a second aperture located in the stop. To complete the flash cycle, the beam is deflected so that shadow of the first aperture impinges upon a second region of the stop, referred to as second blank position. As a result, during the flash cycle, the beam is deflected in one direction to impinge upon two different blank positions.

20 Claims, 7 Drawing Sheets

OTHER PUBLICATIONS

Veneklasen, Lee H. *The continuing delevopment of low–energy electron microscopy for characterizing surfaces*, Rev. Sci. Inst. 63, No. 12, pp. 5513–5532 (1992).

Liu, W. et al. *Micro–objective lens with compact secondary electron detector for miniature low voltage electron beam systems*, J. Vac. Sci. Tech. B 14, No. 6, pp. 3738–3741 (1996).

Thomson, M.G.R. *The electrostatic moving objective lens and optimized deflection systems for microcolumns*, J. Vac. Sci. Tech. B 14, No. 6, pp. 3802–3807 (1996).

Chisholm, Tom et al. *Compact electrostatic lithography column for nanoscale exposure*, J. Vac. Sci. Tech. B 15, No. 6, pp. 2702–2706 (1997).

Rishton, J. et al. *Raster shaped beam pattern generation*, J. Vac. Sci. Tech. B 17, No. 6, pp. 2927–2931 (1999).

Veneklasen et al. *An Integral Field Emission "MicroSem" for UHV Surface Analysis*, $9^{th}$ Congress on Electron Microscopy, Toronto pp. 12–13 (1978).

* cited by examiner

TECHNIQUE FOR WRITING WITH A RASTER SCANNED BEAM

BACKGROUND OF THE INVENTION

The present invention relates generally to pattern generation systems. More specifically, the present invention relates to a column in a lithographic pattern generation system that employs a raster scanned beam writing technique.

Figure 1:
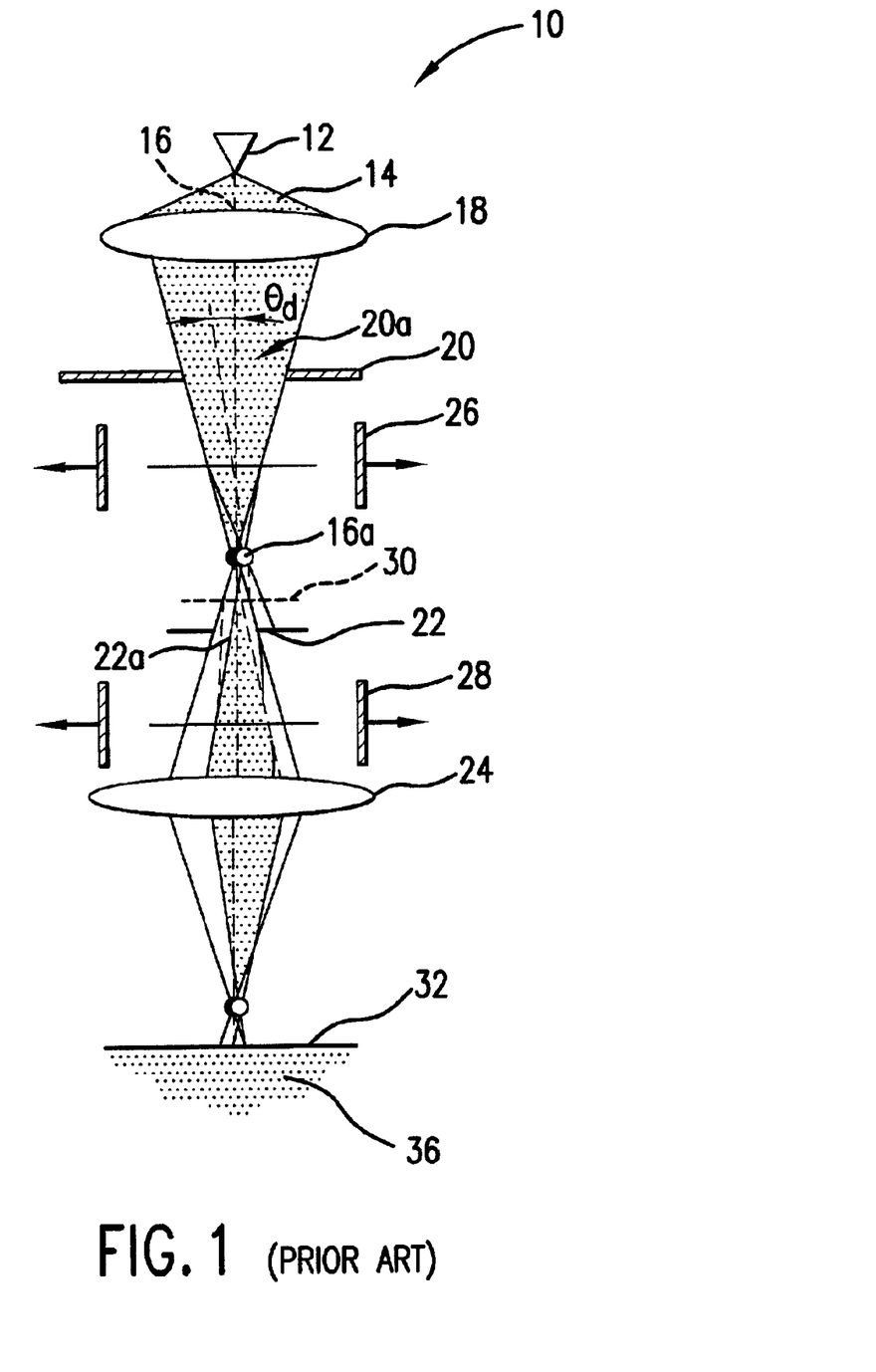
FIG. 1 is simplified plan view of a prior art raster shaped beam lithographic pattern generation system.

FIG. 1 shows an exemplary prior art column 10 employed in a photolithographic pattern generation system that includes a high brightness electron source 12 such as a ZrO Schottky emission cathode with extraction energy of 10 kV. Source 12 produces an electron beam 14 that is directed along a path 16. Disposed in path 16 are a focusing lens 18, a first stop 20, a second stop 22 and an objective lens 24. First stop 20 includes a square aperture 20a that lies in path 16, and second stop 22 includes a rectangular aperture 22a that lies in path 16. Disposed between first stop 20 and second stop 22 is a first deflector 26. A second deflector 28 is disposed between second stop 22 and objective lens 24.

Lens 18 may be a series of magnetic lenses or electrostatic lenses and is used to focus electrons in beam 14 to pass through square aperture 20a. First deflector 26 deflects beam 14 through an angle $\theta_d$ with respect to second aperture 22a, systematically allowing a portion of beam 14 to propagate through objective lens 24, discussed more fully below.

Objective lens 24 defines an object plane 30 located between first deflector 26 and second deflector 28, proximate to second stop 22. Although object plane 30 is shown positioned between first deflector 26 and second stop 22, object plane 30 may be positioned between second deflector 28 and second stop 22. Objective lens 24 images object plane 30 onto an image plane 32. Beam 14 impinges upon image plane 32 as a shadow, as opposed to a focused image, of the overlay of square aperture 20a and rectangular aperture 22a. With this configuration, the area of the shadow impinging upon image plane 32 is determined by the focus of objective lens 24 instead of image magnification. The area of the shadow may be much smaller than the physical size of either first aperture 20a or second aperture 22a, and its size may be adjusted by varying the distance between the cathode crossover 16a and object plane 30. Positioned in object plane 30 is a substrate 36, upon which a pattern is written.

When writing a pattern, it is desireable to provide the highest quality pattern in a minimum amount of time, which is expressed in terms of the pattern coverage rate (R). R specifies the pattern area exposed per second of writing time. R is normally expressed having the dimensions of square centimeters per second ($cm^2$/sec). Thus, it is desireable to employ a pattern writing technique having a high R.

One such pattern writing technique is described by Rishton et al. in *Raster shaped beam pattern generation* J. Vac. Sci. Tech. B17:6, p. 2927 (1999) and employs a graybeam data format to specify a fraction of patterned area within each pixel on a regular grid. The pixel grid is further partitioned into a flash grid, where flash sites include four graybeam data pixels in a 2×2 array. The beam is scanned periodically over the substrate. An exposure amplitude retrograde scan is added to the uniform saw tooth raster scan, so that the beam appears to dwell on each area of exposure for approximately 10 nsec. At each exposure, the pattern is composed using a shaped beam, allowing edges to be positioned on an address grid that is much finer than the pixel grid. The size and shape of the beam is derived from a 4×4 pixel array of graybeam data surrounding the exposure area. The exposure time is varied between about 30%–80% of the exposure cycle time to correct for proximity scattering and other dose error effects.

Pattern exposure is controlled as a function of the flashing and blanking of beam 14. The flash is a portion of the pattern written in image plane 32 during one cycle of an exposure sequence by the presence of beam 14 in image plane 32. The blank is the absence of beam 14 in image plane 32.

Figure 2:
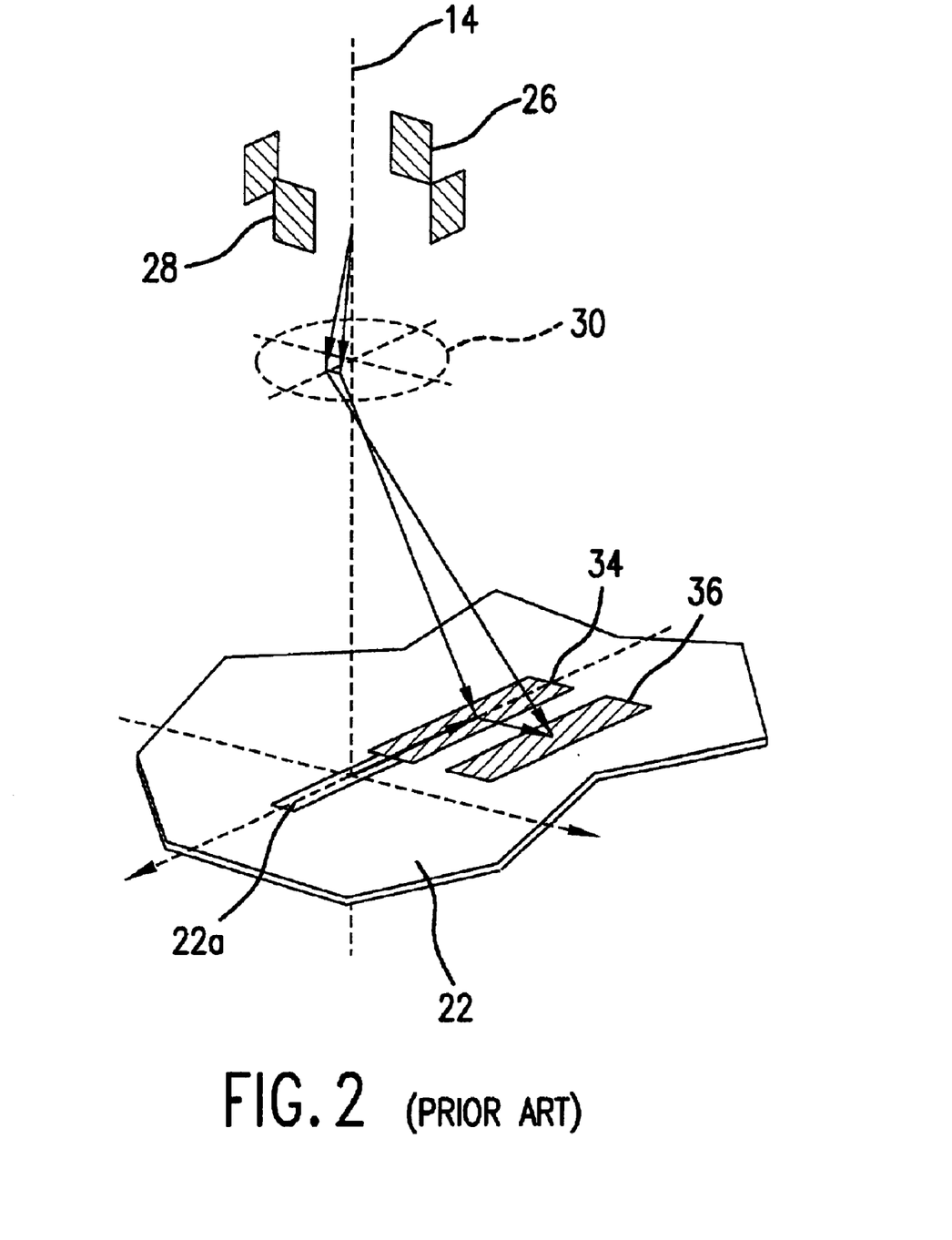
FIG. 2 is a perspective view showing the deflection of a beam with respect to a stop, shown above in FIG. 1 and in accordance with the prior art.

Referring to both FIGS. 1 and 2, a flash occurs when first deflector 26 deflects beam 14 so that a shadow of square aperture 20a superimposes a portion of rectangular aperture 22a, referred to as a flash position 34. A blank occurs when second deflector 28 deflects beam 14 so that no portion of the shadow of square aperture 20a superimposes rectangular aperture 22a, referred to as a blank position 36. First deflector 26 systematically flashes and blanks beam 14 in accordance with the pattern to be written.

Figure 3:
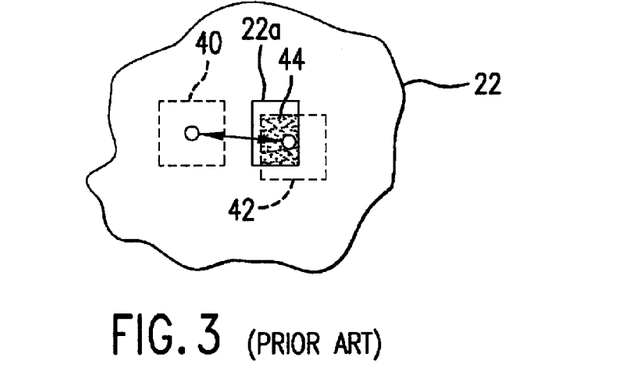
FIG. 3 is a top down view of the stop shown above in FIG. 2 demonstrating a prior art blanking technique.

Referring to FIGS. 1 and 3, a prior art blanking technique is shown. At the commencement of the flash cycle, the shadow of square aperture 20a impinges upon the surface of stop 22, referred to as blank position 40. During the flash cycle, beam 14 is deflected so that the shadow of square aperture 20a moves along a first direction to a flash position 42, in which a portion 44 thereof superimposes rectangular aperture 22a. At the end of the flash cycle, the shadow of the square aperture returns to blank position 40. To that end, beam 14 is deflected so that the shadow of square aperture 20a moves along a second direction, opposite to the first direction.

A drawback with this blanking technique is that it results in an undesirable "shutter" effect, due to the limited bandwidth and settling time of the deflection drive electronics. Specifically, beam 14 impinges upon regions of substrate 36 that should not be exposed when proceeding to the final position. In addition, the presence of a single blanking position, such as blank position 40, results in regions of substrate 36 being exposed longer to beam 14 than other regions. The net result is a non-uniform dose distribution that causes errors in both the location and size of pattern features.

Figure 4:
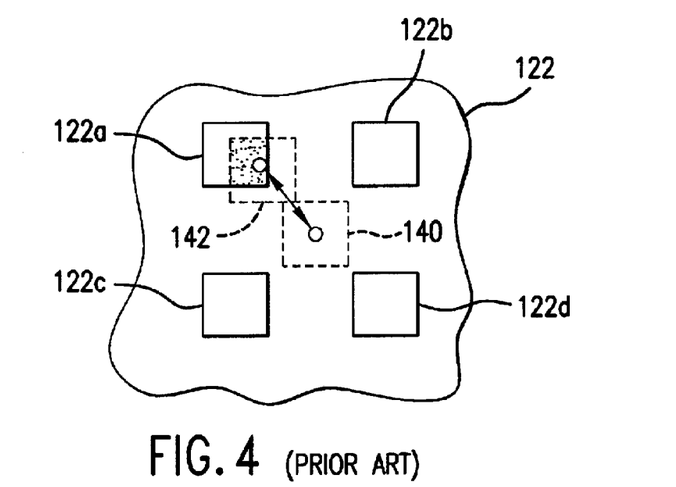
FIG. 4 is a top down view of a multi-aperture stop demonstrating a prior art blanking technique.

Referring to FIGS. 1 and 4, shown is another prior art blanking technique for an alternate embodiment of stop 122. Stop 122 includes four apertures 122a, 122b, 122c and 122d. Beam 14 is deflected so that the shadow of square aperture 20a moves back and forth in opposite directions when traveling between a blank position 140 and a flash position 142. The choice of aperture 122a, 122b, 122c and 122d selected for a flash position depends upon the shape of the region on the substrate to be exposed. This depends upon the relationship between pattern features to be written and the flash grid. As discussed above with respect to FIG. 2, this blanking technique also results in non-uniform dose distribution.

What is needed, therefore, is a blanking technique that provides improved dose uniformity.

SUMMARY OF THE INVENTION

Provided is technique for generating patterns with a photolithographic system that employs a multiple blank position flash cycle. In accordance with one embodiment of the present invention, a beam, creates a shadow of a first aperture that impinges upon a region of a stop, referred to as a first blank position. The beam is deflected so that the shadow of the first aperture moves along a first direction A to a flash position, in which a portion thereof superimposes a second aperture that is located in the stop. To complete the flash cycle, the beam is deflected so that the shadow of the aperture impinges upon a second region of the stop, referred to as a second blank position. As a result, during the flash cycle, the beam is deflected in one direction to impinge upon two different blank positions. During a subsequent flash cycle, the beam moves the shadow of the first aperture along a second direction, which is opposite to first direction. In this manner, the shadow of the aperture moves from blank position and impinges upon the aperture of the second stop. Thereafter, the beam is deflected to move the shadow of the first aperture of the first stop, along the second direction, from impinging upon the second aperture located in the stop to impinge upon the first blank position.

DETAILED DESCRIPTION OF INVENTION

Figure 5:
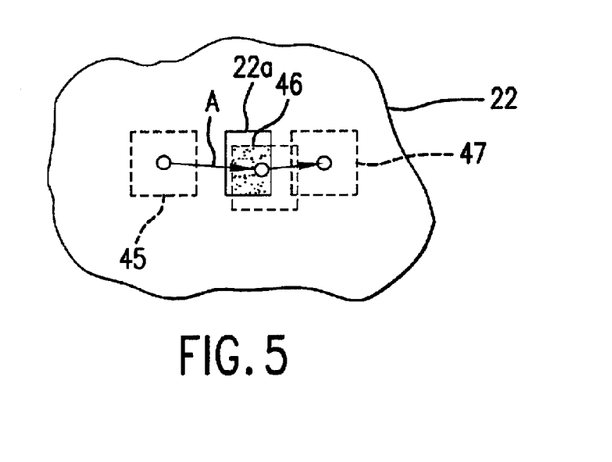
FIG. 5 is a top down view of the stop shown above in FIG. 2 demonstrating a blanking technique in accordance with the present invention.

Referring to FIGS. 1 and 5, a top down view of a blanking technique in accordance with one embodiment of the present invention using second stop 22 is shown. As shown in FIG. 5, during a flash cycle, beam 14 creates a shadow of square aperture 20a that impinges upon a region of second stop 22, referred to as a first blank position 45. Beam 14 is deflected so that the shadow of square aperture 20a moves along a first direction A to a flash position in which a portion 46 thereof superimposes rectangular aperture 22a. To complete the flash cycle, beam 14 is deflected so that shadow of square aperture 20a impinges upon a second region of stop 22, referred to as second blank position 47. As a result, during the flash cycle, beam 14 is deflected in one direction to impinge upon two different blank positions 45 and 47. During a subsequent flash cycle, beam 14 is deflected to move the shadow of square aperture 20a along a second direction, which is opposite to first direction A. In this manner, the shadow of square aperture 20a moves from blank position 47 and impinges upon aperture 22a. Thereafter, beam 14 is deflected to move the shadow of square aperture 20a, along the second direction, from impinging upon square aperture 20a to impinge upon blank position 45. Again, during the flash cycle, beam 14 is deflected in one direction to impinge upon two different blank positions 45 and 47.

Figure 6:
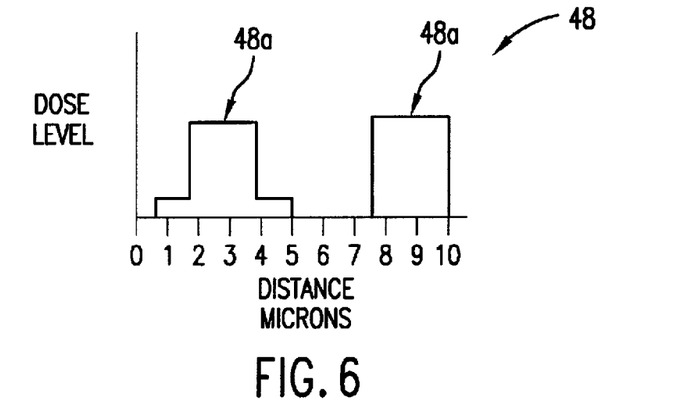
FIG. 6 is a graphical representation showing the dose-uniformity in a region of a substrate employing the blanking technique discussed with respect to FIG. 5.

Referring to FIG. 6, the aforementioned blanking technique minimizes the "shutter effect" in high-speed raster scanning beam (RSB) pattern generation systems. As shown by curves 48, the dose applied to a region of a substrate to generate line patterns is substantially uniform. The substantially planar shape of the upper portions of curves 48 demonstrates the uniformity. This results from beam 14 having one of two states: stationary or moving in one direction, which precludes beam 14 from retracing an area twice during a flash cycle.

Figure 7:
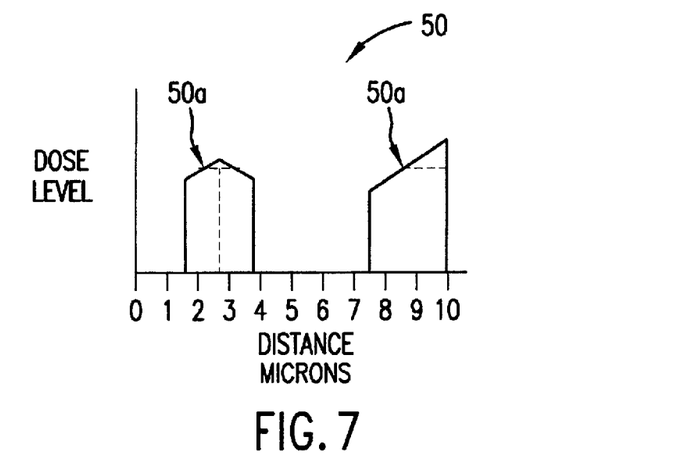
FIG. 7 is a graphical representation showing the dose-uniformity in a region of a substrate employing the blanking technique discussed with respect to FIG. 3.
Figure 8:
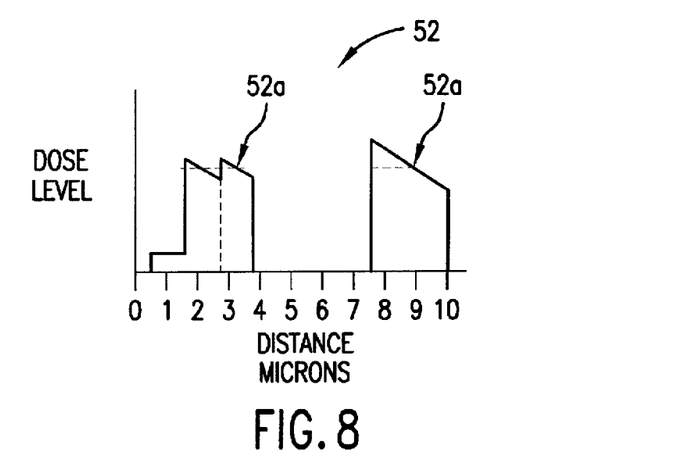
FIG. 8 is a graphical representation showing the dose-uniformity in a region of a substrate employing the blanking technique discussed with respect to FIG. 4.

Referring to FIGS. 6, 7 and 8, curves 50 and 52 show the dose-uniformity provided by the blanking techniques discussed above with respect to FIGS. 3 and 4, respectively. As seen by comparing the upper portions 50a and 52a of curves 50 and 52, respectively, with upper portion 48a, the dose uniformity represented by curve 48 is superior.

For flashes that cover only a fraction of a flash site on substrate 36, beam 14 passes over un-patterned areas of substrate 36 while moving towards a flash site, leaving some residual dose error in these areas. These errors appear as uniformly dosed areas within the gaps, and underexposed areas within the pattern. Adjustment of the flash dwell time in accordance with the flash area compensates for these uniformity errors. For example, the shoulders on the line and gap profiles may be compensated by slightly increasing the dose of partial area flashes, leaving the dose at the middle of the steps at the level necessary to produce the correct line or gap width in the developed resist on substrate 36. This may be done in the flash composition logic by modifying dose according to flash size and type.

Figure 9:
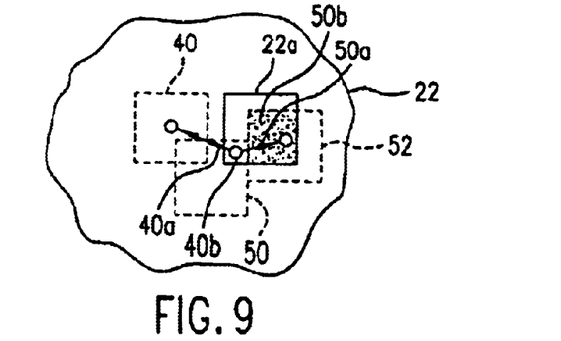
FIG. 9 is a top down view of a stop demonstrating a multiple flash blanking technique in accordance with one embodiment of the present invention and employing the prior art raster shaped beam lithographic pattern generation system discussed above with respect to FIG. 1.

Referring to FIGS. 1 and 9, to facilitate formation of orthogonal pattern shapes and shapes that extend obliquely with respect to a scan direction, a multiple flash blanking technique is demonstrated. In one embodiment of the multiple flash blanking technique, the shadow of square aperture 20a impinges upon the surface of stop 22, referred to as blank position 40. During the flash cycle, beam 14 is deflected so that the shadow of square aperture 20a moves along a first trajectory 40a to a flash position in which a portion 40b thereof superimposes rectangular aperture 22a at first flash position 50. The definition of trajectory, in this case, includes the angle and direction of travel of the shadow. Thereafter, beam 14 is deflected so that the shadow of square aperture 20a moves along a second trajectory 50a to a second flash position 52 in which a portion 50b thereof superimposes rectangular aperture 22a. In this manner, the flash site defined by flash positions 50 and 52 result in a region of substrate 36 being exposed. The area of the region is an "L" shape of the appropriate area and size to compose the 2×2 pixel flash site.

At the end of the flash cycle, the shadow of the square aperture returns to blank position 40. Although the two aforementioned trajectories 40*a* and 50*a* are different, it should be noted that movement is along a common direction to reach the two flash positions. It should be noted, however, the two aforementioned trajectories 40*a* and 50*a* may be identical. Alternatively, the two aforementioned trajectories 40*a* and 50*a* may have differing directions, but a common angle or differing directions and differing angles of movement.

Figure 10:
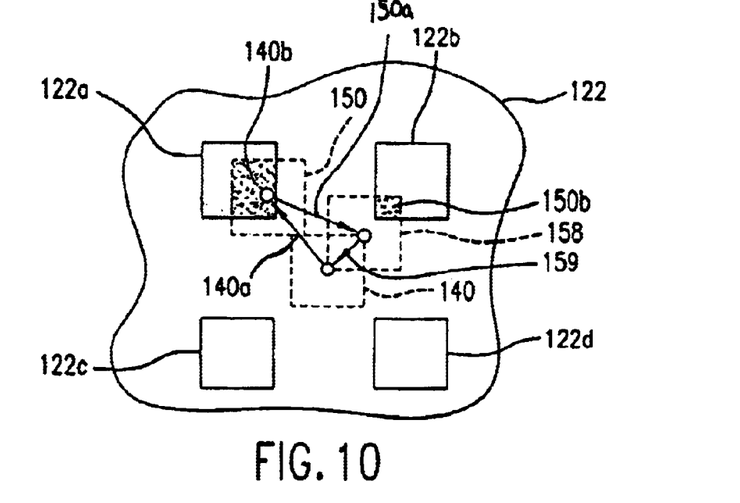
FIG. 10 is a top down view of a stop demonstrating a multiple flash blanking technique in accordance with one embodiment of the present invention and employing the multi-aperture stop discussed above with respect to FIG. 3.

Referring to FIGS. 1 and 10, a multiple flash blanking technique is shown in which the aforementioned trajectories of beam 14 to each flash position have differing directions and differing angles of movement, with respect to a multi-aperture stop 122 having four apertures 122*a*, 122*b*, 122*c* and 122*d* present. Beam 14 is deflected so that the shadow of square aperture 20*a* moves along a first trajectory 140*a* from blank position 140 to a first flash position 150. In the first flash position 150, a portion 140*b* of the shadow of aperture 20*a* superimposes one of the apertures, shown here as aperture 122*a*. Thereafter, beam 14 is deflected to move along a second trajectory 150*a* from flash position 150 to have a portion 150*b* of the shadow of aperture 20*a* superimpose a second flash position 158. In the second flash position 158, the shadow of aperture 20*a* superimposes aperture 122*b*. However, it should be understood that flash position 150 and second flash position 158 may be in a common aperture. Thereafter, beam 14 is deflected to move the shadow of aperture 20*a* along a third trajectory 159 to blank position 140. As before, the area of the two flashes exposed on a substrate defines an "L" shape of the appropriate area and size to compose the 2×2 pixel flash site.

Figure 11:
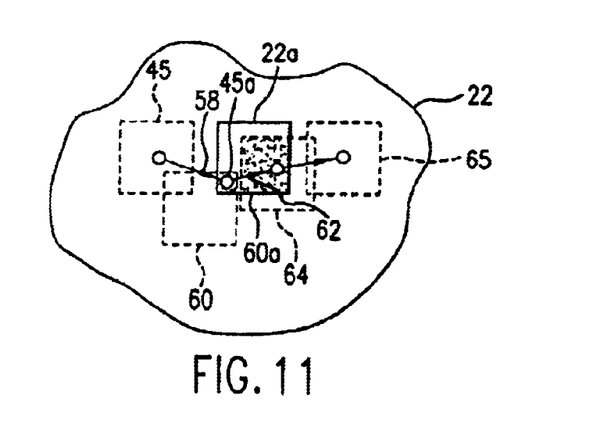
FIG. 11 is a top down view of a stop demonstrating a multiple flash blanking technique incorporated into the blanking technique discussed above with respect to FIG. 5 and in accordance with the present invention.

Referring to FIGS. 1 and 11, a top down view of a multiple flash blanking technique in accordance with another embodiment of the present invention using second stop 22 is shown. During a flash cycle, beam 14 creates a shadow of square aperture 20*a* that impinges upon a first blank position 45. Beam 14 is deflected so that the shadow of square aperture 20*a* moves along a trajectory 58 to a first flash position 60 so that a portion 45*a* of the shadow superimposes rectangular aperture 22*a*. Thereafter, beam 14 is deflected so that the shadow of square aperture 20*a* moves along a trajectory 62 to a second flash position 64. In second flash position, a portion 60*a* of the shadow of square aperture superimposes rectangular aperture 22*a*. To complete the flash cycle, beam 14 is deflected so that shadow of square aperture 20*a* impinges upon a second region of stop 22, referred to as second blank position 65. As a result, during the flash cycle, beam 14 is deflected in one direction to impinge upon two different blank positions 45 and 65, and moves in an opposite direction, as discussed above with respect to FIG. 5, to provide one or more flashes before reaching blank position 45.

In the aforementioned multiple flash blanking technique, less time is available to expose each of the two flashes, compared to a single flash blanking technique. A maximum flash exposure time of about 60% of the flash cycle is used, so that the beam has time to return to its blanking site between flashes. When two flashes are needed to expose an "L" shaped area, the cycle is increased to 80%, and each of the flashes usually last no more than 40% of the cycle. This may leave interior corners slightly under-dosed. Fortunately, additional dose scatters into an interior corner from surrounding flashes, so it may be desirable to under-dose regions (not shown) of substrate 36 in which orthogonal patterns are formed. In this manner, the associated dose error is not as significant as might otherwise be expected. Alternatively, the current of beam 14 may be increased so that no more than 40% of a flash cycle is needed to expose any flash. In either case, if sufficient current is available, an "L" shaped flash may be composed without reducing throughput.

Figure 12:
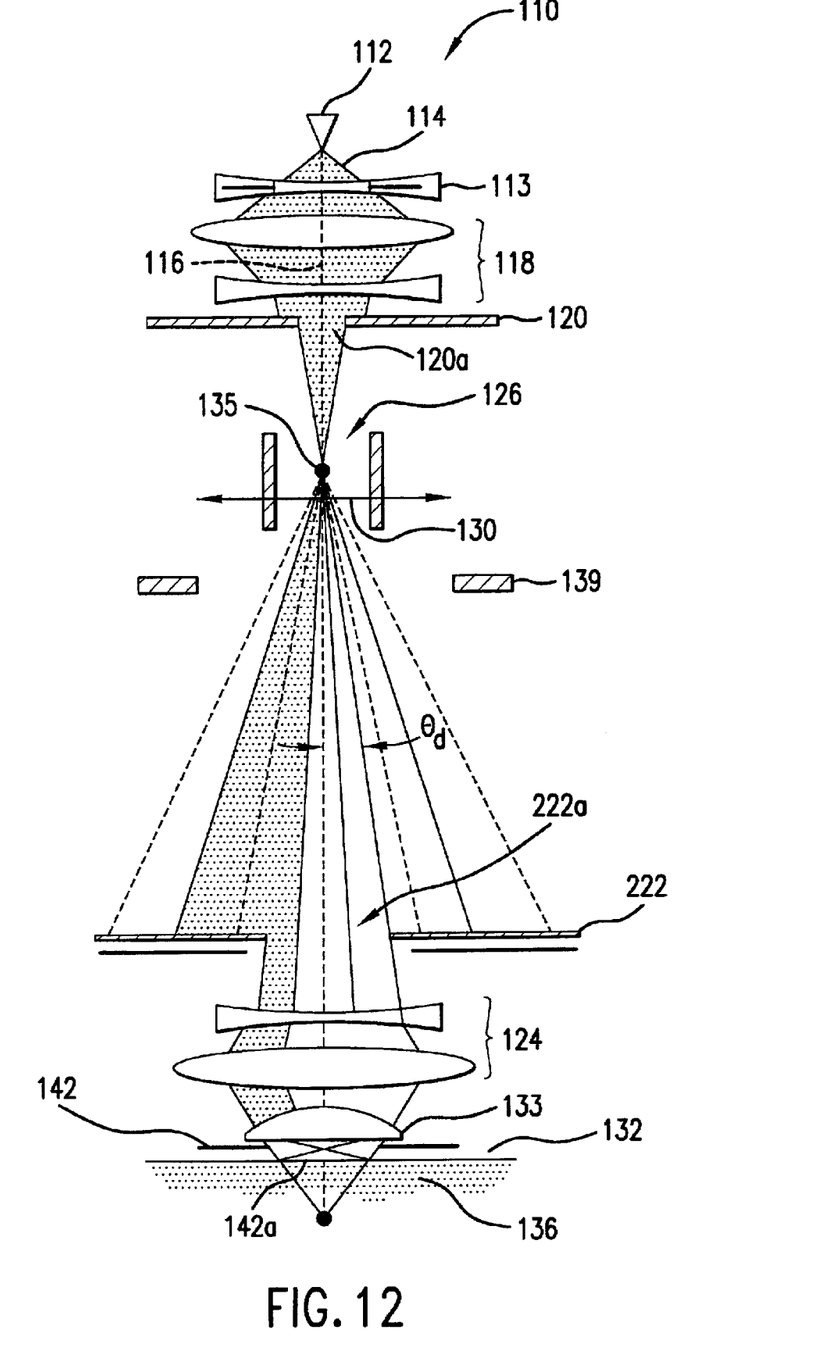
FIG. 12 is a plan view of a raster scan beam illumination system that may be employed to practice any of the blanking techniques discussed with respect to FIGS. 3, 4, 5, 9, 10 and 11, in accordance with the present invention.

Referring to FIG. 12, shown is a column 110 that may be employed in a raster shaped beam lithographic pattern generation system to practice the blanking techniques discussed above, with respect to FIGS. 3, 4, 5, 9, 10 and 11. As shown in FIG. 12, column 110 is designed to generate patterns on a substrate 136 employing a single stage deflector to deflect a shadow projection of a beam having energy in the range of 0.5–1.0 kV. To that end, column 110 includes an electron source, such as a focusing electrode 112 and an extractor 113 to direct a beam 114 of electrons along a path 116. A focusing lens assembly 118 is disposed in path 116. A first stop 120, having a first aperture 120*a*, and a second stop 222, having a second aperture 222*a* are disposed in path 116. An objective lens assembly 124 is disposed in path 116, with first and second stops 120 and 222 being positioned between objection lens assembly 124 and focus lens assembly 118. A shaping deflector 126 is positioned in path between first and second stops 120 and 222. Objective lens assembly 124 defines an object plane 130, with deflector 126 lying in object plane 130.

Cathode 112 may be any e-beam source in the art, one example of which is ZrO Schottky emission cathode with extraction energy of 10 keV, an effective source diameter of about 20 nm, an angular intensity of about 1 mA/sr, and a brightness of about $3 \times 10^8$A/sq.cm/sr. Beam 114 passes through focus lens assembly 118, which is a stack of aligned electrodes biased to about −8 kV. An exemplary focus lens assembly 118 may be a decelerating Einzel lens, focusing an image of cathode 112 in a drift space between cathode source 112 and objective lens assembly 124. Specifically, aperture 120*a* provides the portion of beam 114 propagating therethrough with a square cross-section. The cathode image, referred to as crossover 135, is focused at a point along path 116 located between first stop 120 and objective lens assembly 124.

Deflector 126 is located proximate to object plane 130 and causes beam 114 to move transversely to path 116 systematically blanking and flashing the shape of aperture 120*a* with respect to second stop 222. The portion of beam 114 passing through second aperture 222*a* has a shape that corresponds to the shape comprising the superimposition of first and second apertures 120*a* and 222*a*.

The portion of beam 114 passing through first and second apertures 120*a* and 222*a* enters objective lens assembly 124 and forms a much smaller shadow projection, onto image plane 132, compared to the area of the resulting shapes defined by the superimposition of first and second aperture 120*a* and 222*a*. Cross-over 135 is positioned proximate to image plane 132 allowing the shadow of the aperture 120*a* to be positioned upon aperture 222*a* without shifting the shadow of aperture 120*a* on image plane 132 and, therefore, substrate 136. A shield 142 having an aperture 142*a* disposed therein is positioned between lens 133 and image plane 132. Shield 142 prevents electrons backscattering off of substrate 136 from reaching lens 133. To that end, shield 142 is biased to −9 kV.

Objective lens assembly 124 is a stack of aligned electrodes biased to about −15 kV. An exemplary objective lens assembly 124 may include either a triode or a tetrode cathode lens. One such lens is described by Chmelik et al. in *Comparing cathode lens configurations for low energy electron microscopy*, Optik 83, 1 p. 155 (1989). Were a tetrode lens employed, then an intermediate retarding field lens, shown as 133, may be disposed between objective lens assembly 124 and image plane 132. Lens 133 is biased to a level of about −7 kV and functions to focus beam 114 before entering the decelerating region just above the image plane 132 where substrate 136 is positioned. An intermediate anode (not shown) is typically employed with a tretrode objective lens to slow beam 114 in two stages. The anode (not shown) may provide stronger focusing by operating the same in an accelerating mode with a positive potential. In both cases, beam 114 traverses most of the beam path at about 10-kV extraction energy, and is decelerated from about −10 kV to the final beam energy of 0.5 to 1 kV in a very short region just above image plane 132. To provide retroscan and beam position offset, a separate deflection system 139 may be positioned proximate to second stop 222, between second stop and objective lens assembly 124.

An appropriate arrangement might provide aperture 142a with a 300 um diameter, spaced about 100 um from the surface of substrate 136. To maximize the scan field size, it is desirable to minimize the disturbance of the electric field distribution near the substrate. Accordingly, the aperture should be thin. For example were the distance between lens 133 and image plane 132 approximately 3 mm, and the distance between the aperture 142a and image plane 132, 0.1 mm, then the aperture would be biased 1/30 of the way between substrate and second anode potential.

Column 110 is configured so that aperture 222a is larger than aperture 120a. By properly positioning object plane 130, the shadow of aperture 120a formed by beam 114 does not move in image plane 132, and the shadow formed by aperture 222a moves within a flash area defined by first aperture 120a. Further, the area of the beam at the image plane 132 depends upon a distance between crossover 135 and object plane 130, which in this embodiment, is defined by the focal length of focus lens assembly 118. The use of a single deflection device, such as deflector 126, with limited drive voltage is afforded by maintaining beam energy in the drift space between focus lens 118 and objective lens assembly 124 to be approximately −10 kV. This allows much larger shape deflection angle $\Theta_d$ using the limited shaper drive voltage. With higher drive voltages, this configuration could also be used in higher voltage pattern generation systems, as well as electrostatic focusing.

Figure 13:
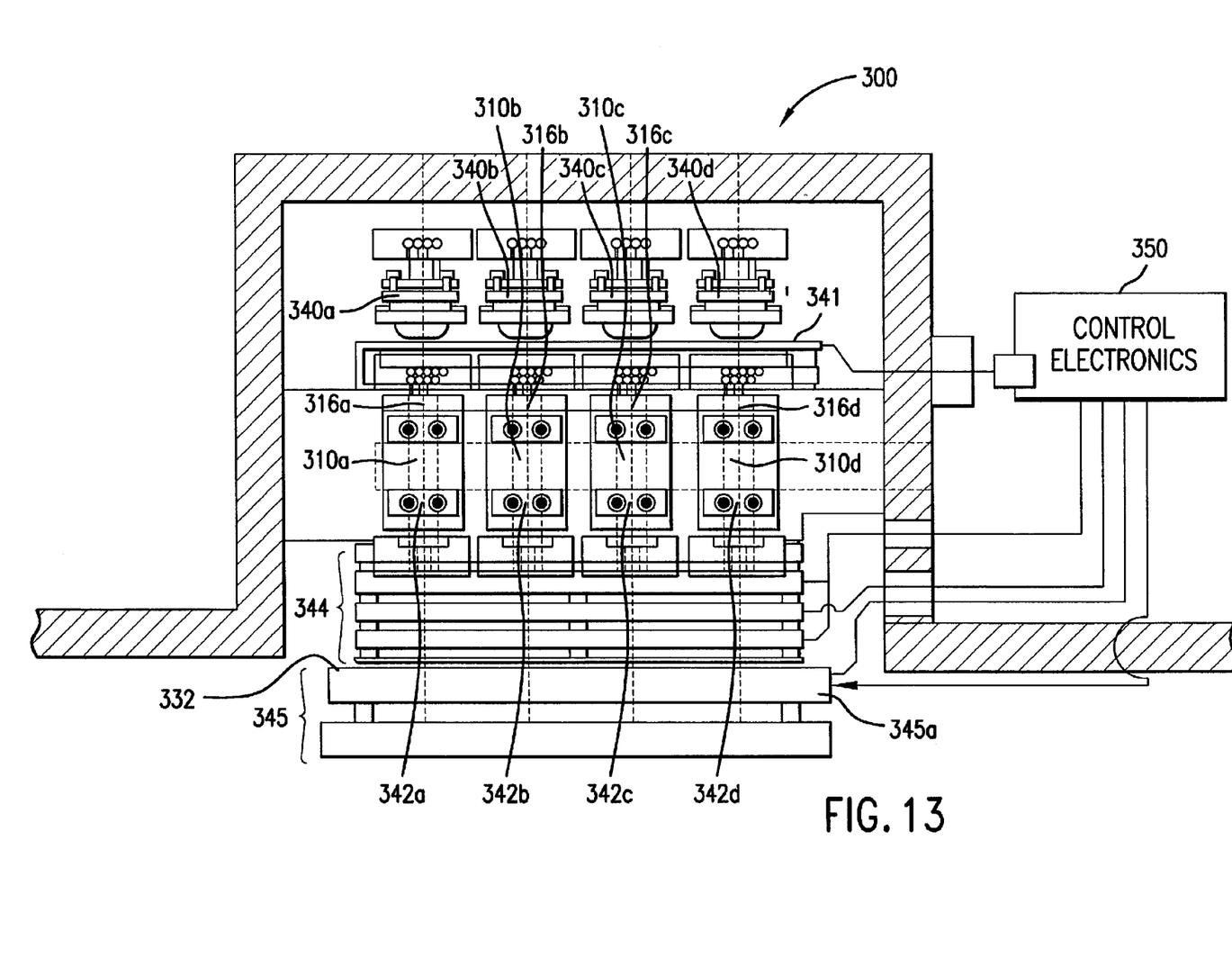
FIG. 13 is side view of an array of the illumination system shown in FIG. 12, in accordance with the present invention.

Referring to FIGS. 12 and 13, typically column 110 is employed in a system 300 as an array of columns. Although any number of columns may be present in the array, one example of the present invention includes a 4×2 array of columns, four of which are shown as 310a, 310b, 310c and 310d, which include extractor systems 340a, 340b, 340c and 340d. Also included with columns 310a, 310b, 310c and 310d are shaper drive modules 342a, 342b, 342c and 342d, respectively.

System 300 includes a gun lens assembly 341 and an objective lens apparatus 344, each of which consists of a stack of aligned electrodes. Included within gun lens assembly 341 is a focus lens assembly 118. Included within objective lens apparatus 344 are objective lens assembly 124, 133 and shield 142. The gun lens assembly 341 is arranged with respect to extractors systems 340a, 340b, 340c and 340d to allow a beam (not shown) to propagate along a path 316a, 316b, 316c and 316d, respectively, and impinge upon shaper drive modules 342a, 342b, 342c and 342d, respectively. Objective lens apparatus 344 is arranged so that the beam (not shown) propagating from shaper drive modules 342a, 342b, 342c and 342d impinges upon image plane 332 where a substrate (not shown) is positioned. Specifically, image plane 332 lies proximate to a stage assembly 345. Stage assembly 345 includes a sub-stage 345a upon which the substrate is disposed (not shown). Stage 345 moves along in the plane of FIG. 13, thereby facilitating movement between the array of columns 310a, 310b, 310c and 310d and the substrate (not shown).

Operation of system 300 is regulated by control electronics 350, which includes a processor and power supply, which provide the deflection and dynamic correction signals to the deflection plates and movement of stage 345. Columns 310a, 310b, 310c and 310d may be driven in common to minimize the number of fast, high voltage scan drive amplifiers.

Although the invention has been described in terms of specific embodiments, one skilled in the art will recognize that various modifications may be made that are within the scope of the present invention. For example, any shaped aperture may be employed in the stops mentioned above and the exposure region, although being described as being L-shaped, may be any shape desired. Therefore, the scope of the invention should not be based upon the foregoing description. Rather, the scope of the invention should be determined based upon the claims recited herein, including the full scope of equivalents thereof.

What is claimed is:

1. A method for writing a pattern on a substrate by systematically blanking and flashing a beam along a path employing a stop having an aperture disposed therein, said method comprising:

impinging said beam upon a first region of said stop, defining a first blank position; moving said beam, along a first direction, from said first blank position to a flash position located within said aperture;

moving said beam, along said first direction, from said flash position to impinge upon a second region of said stop, defining a second blank position; and wherein said first direction is transverse to said path.

2. The method as recited in claim 1 further including moving said beam, along a second direction transverse to said path, opposite to said first direction, from said second position to propagate through said aperture, after moving said beam to impinge upon said second blank position, and repeatably moving said beam to successively impinge upon said first and second blank position to have said beam periodically propagate through said aperture.

3. The method as recited in claim 1 further including moving said beam, after impinging said beam upon said first blank position and before moving said beam to impinge upon said second blank position, to impinge upon an additional flash position.

4. The method as recited in claim 3 wherein said stop includes additional apertures, with said additional flash position on said stop being located within differing apertures.

5. The method as recited in claim 3 wherein said beam moves along a common trajectory when moving from said first blank position to impinge upon said flash position and moving from said flash position to impinge upon said additional flash position.

6. The method as recited in claim 3 wherein said beam moves along a first trajectory from said first blank position to impinge upon said flash position and along a second trajectory from said flash position to impinge upon said additional flash position, with said first trajectory being different from said second trajectory.

7. The method as recited in claim 1 further including providing a beam source and an additional stop, disposed between said stop and said beam source, with said additional stop including an additional aperture which superimposes said aperture, with said stop and said additional stop being disposed between said beam source and said substrate, with said beam propagating through said aperture having a cross-sectional area with a shape of said cross-sectional area being defined by a superimposition of said aperture and said additional aperture.

8. The method as recited in claim 7 wherein said cross-sectional area has an "L" shape.

9. The method as recited in claim 2 further including having said aperture superimpose an area of said substrate to be exposed, wherein said flash position is defined, wherein repeatably moving said beam further includes moving said substrate with respect to said beam while periodically propagating said beam through said aperture to expose a plurality of said flash positions on said substrate.

10. A method for writing a pattern on a substrate by systematically blanking and flashing a beam along a path, produced by a beam source, employing first and second stops, disposed between said beam source and said substrate, with each of said stops having an aperture associated therewith defining first and second apertures, respectively, said method comprising:

impinging said beam upon a first region of said second stop, defining a first blank position;

moving said beam, along a first direction, from said first blank position to a flash position located within said second aperture, with said beam propagating through said second aperture having a cross-sectional area, a shape of which being defined by a superimposition of said first and second apertures;

moving said beam, along said first direction, from said flash position to impinge upon a second region of said second stop, defining a second blank position;

moving said beam, along a second direction, opposite to said first direction, from said second blank position to propagate through said second aperture, after moving said beam to impinge upon said second blank position, and repeatably moving said beam to successively impinge upon said first and second blank positions to have said beam periodically propagate through said aperture and impinge upon said substrate; and wherein said first direction and said second direction are transverse to said path.

11. The method as recited in claim 10 further including having said aperture superimpose an area of said substrate to be exposed, wherein said flash position is defined, wherein repeatably moving said beam further includes moving said substrate with respect to said beam while periodically propagating said beam through said aperture to expose a plurality of said flash positions on said substrate.

12. The method as recited in claim 10 further including moving said beam, after impinging said beam upon said first blank position and before moving said beam to impinge upon said second blank position, to impinge upon an additional flash position, located within said second aperture.

13. The method as recited in claim 12 wherein said beam moves along a common trajectory when moving from said first blank position to impinge upon said flash position and moving from said flash position to impinge upon said additional flash position.

14. The method as recited in claim 12 wherein said beam moves along a first trajectory from said first blank position to impinge upon said flash position and along a second trajectory from said flash position to impinge upon said additional flash position, with said first trajectory being different from said second trajectory.

15. A system for writing a pattern on a substrate by systematically blanking and flashing a bean along a path employing a stop having an aperture disposed therein, said system comprising:

means for impinging said beam upon a first region of said stop, defining a first blank position;

means for moving said beam, along a first direction, from said first blank position to a flash position located within said aperture;

means for moving said beam, along said first direction, from said flash position to impinge upon a second region of said stop, defining a second blank position; and wherein said first direction is transverse to said path.

16. A system for writing a pattern on a substrate, comprising:

a source to direct a beam of energy along a path;

a stop, disposed in said path, having an aperture formed;

a displacement mechanism to spatially displace said substrate with respect to said path in accordance;

a writing plane, disposed in said path proximate to said substrate, with said beam forming a shadow of said aperture impinging upon said writing plane;

a deflector disposed proximate to said stop to deflect said beam;

a processor in data communication with said source, said deflector and said displacement mechanism;

a memory in data communication with said processor, said memory comprising a computer-readable medium having a computer-readable program embodied therein, said computer-readable program including a first set of instructions for controlling said deflector to move said beam, along a first direction, from impinging upon a first region of said stop, defining a first blank position, to impinge upon a flash position located within said aperture; and a second set of instructions to control said deflector to move said beam, along said first direction, from impinging upon said flash position to impinge upon a second region of said stop, defining a second blank flash position; and wherein said first direction is transverse to said path.

17. The system as recited in claim 16 wherein said computer-readable program further includes a third set of instructions for controlling said deflector to move said beam, along a second direction transverse to said path, opposite to said first direction, from impinging upon said second blank position to propagate through said aperture, and repeatably moving said beam to successively impinge upon said first and second blank positions to have said beam periodically propagate through said aperture.

18. The system as recited in claim 16 wherein said computer-readable program further includes a third set of instructions to control said deflector to move said beam, after impinging said beam upon said first blank position and before moving said beam to impinge upon said second blank position, to impinge upon an additional flash position to expose an "L" shaped region on said substrate.

19. The system as recited in claim 18 further including an additional stop including an additional aperture that superimposes said aperture, with said stop and said additional stop being disposed between said source and said image plane, with said beam propagating through said aperture having a cross-sectional area with a shape of said cross-sectional area being defined by a superimposition of said aperture and said additional aperture.

20. The system as recited in claim 18 wherein said computer-readable program further includes a fourth set of instructions to control said displacement mechanism, said source and said deflector to periodically propagate through said aperture while moving said substrate with respect to said beam to expose a plurality of flash sites on said substrate.

* * * * *